United States Patent [19]
Penunuri

[11] Patent Number: 5,854,579
[45] Date of Patent: Dec. 29, 1998

[54] SAW FILTER USING LOW-PASS CONFIGURATION AND METHOD OF PROVIDING THE SAME

[75] Inventor: David Penunuri, Fountain Hills, Ariz.

[73] Assignee: Motorola Inc., Schaumburg, Ill.

[21] Appl. No.: 920,192

[22] Filed: Aug. 25, 1997

[51] Int. Cl.⁶ .............................. H03H 9/64; H03H 9/72
[52] U.S. Cl. ....................... 333/193; 333/133; 310/313 B
[58] Field of Search ............................ 333/133, 193–196; 310/313 R, 313 B, 313 C, 313 D

[56] References Cited

U.S. PATENT DOCUMENTS

| 5,434,466 | 7/1995 | Hickernell et al. | 310/313 D |
| 5,471,178 | 11/1995 | Hickernell | 33/193 |
| 5,506,552 | 4/1996 | Seki et al. | 333/195 |
| 5,600,287 | 2/1997 | Kwan et al. | 333/195 |
| 5,638,036 | 6/1997 | Penunuri et al. | 333/194 |

FOREIGN PATENT DOCUMENTS

| 4-54011 | 2/1992 | Japan | 333/193 |
| 6-61783 | 3/1994 | Japan | 333/193 |

*Primary Examiner*—Robert Pascal
*Assistant Examiner*—Barbara Summons
*Attorney, Agent, or Firm*—Brian M. Mancini; Gary J. Cunningham

[57] ABSTRACT

An acoustic wave resonator filter (10) provides series and shunt resonator elements (22, 24) in a ladder network. The series elements (22) are configured in a lowpass configuration. The shunt elements (24) act as impedance inverters in a passband of the filter and they series resonate at an antiresonant frequency of the series elements (22) in a stopband which provides additional isolation. The electrodes (14) of the elements (22, 24) are of a metal thickness which improve the losses of a series resonant frequency in a passband which improves insertion loss. However, any increase in loss near the antiresonant frequency is compensated by the reduced loss near the resonant frequency of the shunt elements (24). The lowpass configuration and the aligned series element antiresonant frequency and shunt element resonant frequency provides good insertion loss, good isolation between transmitting and receiving bands, and maintains good stopband characteristics while reducing the number of elements required for the ladder network.

16 Claims, 5 Drawing Sheets

FIG.3 —PRIOR ART—

SAW FILTER USING LOW-PASS CONFIGURATION AND METHOD OF PROVIDING THE SAME

FIELD OF THE INVENTION

The present invention relates in general to acoustic wave filters, and in particular to leaky and surface skimming bulk wave filters and Rayleigh and surface acoustic wave filters.

BACKGROUND OF THE INVENTION

Filters are needed for a variety of such communications applications wherein smaller size, lighter weight, lower cost and higher performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or inter-equipment information sharing requirements. The desire to render increasingly complicated communications nodes including portable, hand-held and pocket-sized radios places extreme demands on filtering technology and performance.

For example, one of the larger components frequently found in existing wireless analog radio communication devices is a dielectric (ceramic) antenna filter used to duplex transmitter and receiver portions of the radio device. These ceramic filters can provide a 2 dB insertion loss at about 850 MHz with 25 MHz bandwidth. However, these filters are also large and heavy.

Existing surface acoustic wave (SAW) filters are much smaller and lighter than ceramic filters and comparable in cost. However, typical existing surface acoustic wave filters provide 3–4 dB insertion loss which does not meet the performance of existing ceramic filters or the performance needs of state-of-the art radio communication devices. The need for low passband insertion loss simultaneously coupled with a demand for high isolation between transmitter and receiver bands pose filter configuration and performance requirements that are not easily met.

The frequency response of typical prior art duplexer filters for a cellular phone application have the general form shown in FIGS. 1 and 2. FIG. 1 shows a general form of a transmit filter frequency response. The key requirement for the Tx filter is to pass transmitter energy in the Tx band and to suppress any transmitter energy inadvertently generated in the Rx band. FIG. 2 shows a general form of a receive filter frequency response. The key requirement for the receive (Rx) filter is to pass input signals with a frequencies in the Rx band and to reject or block signals with frequencies in the transmit (Tx) band. Frequently, Tx filters have been configured as true bandpass filters using SAW resonators connected in a ladder network as seen in FIG. 3. The SAW resonators are configured to exhibit an impedance-versus-frequency characteristic with a series resonant frequency and a parallel resonant frequency. This has been accomplished by having the series resonant frequency of the series connected resonators 1 being approximately equal to the parallel resonant frequency of the shunt connected resonators 2. In general, the loss of all the resonators 1, 2 must be low to produce a good filter response. Also, the bandpass configuration places limitations on the filter performance with regards to isolation, bandwidth, bandstop rejection, and insertion loss.

FIG. 4 shows a measured response 3 of the prior art SAW filter of FIG. 3 which exhibits several problems with respect to the Tx function for a given specification. Since the insertion loss is about 3 dB, the filter bandwidth is too narrow to comfortably meet the Tx specification 4, particularly in regards to frequency shifts due to temperature variations. Also, the large amplitude variation across the passband is inconsistent with active power leveling which is required by cellular phones to stabilize output power. The stopband 6 of the response 3 is adequate to meet the Rx specification 5 as long as the loss at the parallel resonance of the series connected resonators is minimized.

What is needed is an acoustic filter configuration providing suitable isolation between transmitter and receiver frequency bands. It is also desired to provide low passband insertion loss. Further, acceptable stopband performance in a configuration realizable in compact, robust and monolithic form would provide an advantage.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE PREFERRED EMBODIMENT

The present invention provides an acoustic wave (e.g., SAW, surface skimming bulk wave, leaky wave etc.) resonator filter for use near 1 GHz which has a volume and weight which is much smaller than a similar ceramic filter by almost an order of magnitude. Furthermore, since SAW devices are readily manufactured using high capacity photolithographic and wafer processing techniques, the SAW resonator filters are of a very low cost. Moreover, SAWs do not require tuning as do ceramic filters. In addition, SAW devices have demonstrated the capability of handling typical transmit powers required by cellular systems. Finally, the present invention provides performance substantially equal to existing ceramic filters as will be described below.

Figure 5:
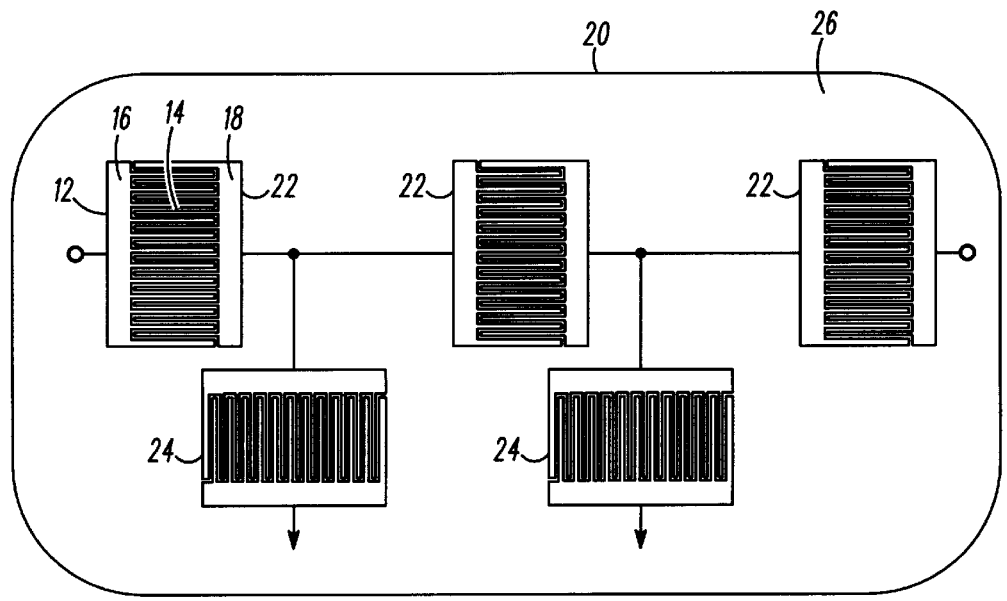
FIG. 5 is a simplified plan view of an acoustic wave resonator filter, in accordance with the present invention.

FIG. 5 is a simplified plan view of an acoustic wave resonator filter 10 including a number of acoustic wave transducers 12. Each of the transducers 12 include interdigitated electrodes 14 (also referred to herein an "fingers", "finger electrodes", etc.) electrically coupled alternately to a first terminal 16 and a second terminal 18, in accordance with the present invention.

The electrodes 14 typically are periodic and define a particular acoustic wavelength at which the transducer 12 resonates at a characteristic acoustic center frequency together with a center frequency wavelength for the acoustic energy transduced in response to electrical stimulation of an appropriate frequency applied via the terminals 16, 18. The electrodes 14 are usefully one-fourth of this center frequency wavelength wide, i.e., measured along directions in accordance with design principles and performance objectives for the transducer 12. The electrodes 14 are disposed on one-half acoustic wavelength centers, usually alternately coupled to their associated first and second terminals 16, 18, respectively.

Electrical stimulation at an appropriate frequency supplied from the electrical terminals 16, 18 and thence to the interdigitated or interleaved electrodes 14 results in acoustic waves being generated within the transducer 12. As used herein, the term "acoustic wavelength" is taken to mean an acoustic wavelength at the filter center frequency, i.e., in the nominal center of the filter passband.

The transducer 12 is typically fabricated on a polished substrate 20 by depositing and patterning a thin metal film, often comprising aluminum, in a thickness ranging from about 500 Å to about 7000 Å thick, by techniques similar to those employed in integrated circuit manufacturing.

Figure 9:
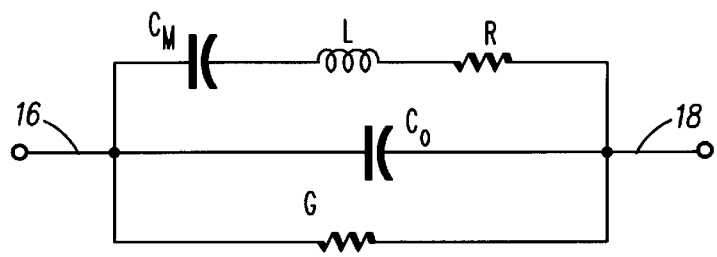
FIG. 9 shows a schematic diagram of an equivalent electrical circuit for a SAW resonator.
Figure 10:
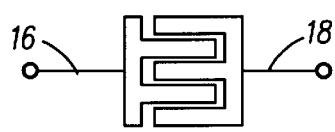
FIG. 10 is a simplified plan view of a SAW resonator.

Each transducer 12 can be modeled by an equivalent circuit, as shown in FIG. 9, which captures the salient electrical features of the SAW resonator (as represented in FIG. 10), e.g., a resistance R having one lead coupled to terminal 18, in series with an inductor having inductance L coupled in series with a capacitor having capacitance $C_m$ and having a lead coupled to terminal 16. The above series combination is bridged by a capacitor having capacitance $C_o$ (i.e., coupled from terminal 16 to terminal 18) and a conductance G. Values for components $C_o$, $C_m$, L, R and G are found from the geometry of the transducer 12, and relevant material constants, and Eqs. 1–3 (infra). R and G may be usefully ignored or may be modeled from empirical data. R and G represent one or more of: bulk wave radiation, acoustic propagation away from the electrodes, metal resistivity, diffraction effects and other losses encountered in acoustic resonant elements. Static capacitance, $C_o$, is found from:

$$C_o = C_e N W \qquad (1)$$

where $C_e$ is a material parameter describing capacitance per finger pair per cm (tabulated for many materials in a variety of textbooks), N represents the number of transducer finger pairs (e.g., pairs of electrodes 14 in transducer 12) and W represents the overlap of electrodes 14 or beamwidth in centimeters.

Motional capacitance, $C_m$, is related to static capacitance, $C_o$, by:

$$C_m = \frac{8k^2 C_o}{\pi^2} \qquad (2)$$

where $k^2$ represents the electromechanical coupling coefficient of the piezoelectric substrate 20 (tabulated in a variety of textbooks related to piezoelectric materials). Motional inductance, L, is given by:

$$L = \frac{1}{C_m \omega_r^2} \qquad (2)$$

where $\omega_r$ represents the transducer resonant frequency in radians.

Admittance, Y, measured between terminals 16, 18 of FIG. 5 is:

$$Y = G + j\omega C_o + \frac{1}{R + j(\omega L - (1/\omega C_m))} \qquad (4)$$

Admittance, Y, has resonant frequency $\omega_r$, usually close to and slightly lower than the acoustic center frequency (approximately the sound velocity divided by the acoustic wavelength associated with the periodicity of electrodes 14 of the transducer 12):

$$\omega_r = \frac{1}{\sqrt{LC_m}} \qquad (5)$$

and antiresonant (or parallel resonant) frequency, $\omega_a$, where:

$$\omega_a = \omega_r \sqrt{1 + C_m/C_o} \qquad (6)$$

or $$\omega_a = \omega_r \sqrt{1 + 8k^2/\pi^2} \qquad (7)$$

For a given transducer 12, the antiresonant frequency, $\omega_a$, is always greater than resonant frequency, $\omega_r$, by a ratio determined by electromechanical coupling coefficient $k^2$ (see Eq. 7). For extremely high coupling coefficients (e.g., $k^2 > 5\%$), an appropriate coupling coefficient value may need to be empirically determined because the assumptions employed in relating physical parameters (e.g., acoustic wavelength, radiation conductance, $\omega_a$, $\omega_r$ etc.) to each other and to acoustic center frequencies are not entirely valid.

Figure 11:
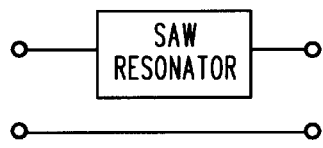
FIG. 11 shows a simplified schematic diagram of a series-connected SAW resonator.
Figure 12:
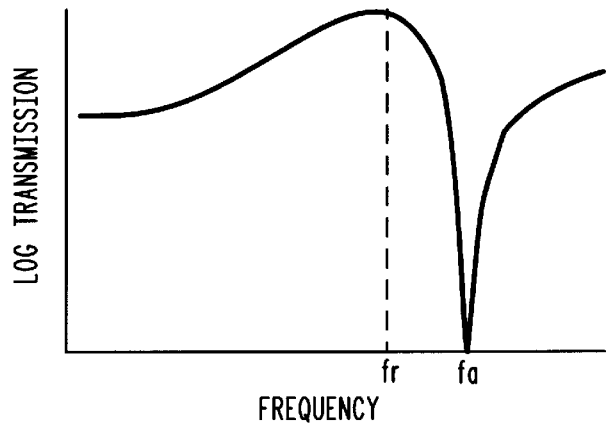
FIG. 12 shows a graphical representation of a frequency response of the resonator of FIG. 11.
Figure 13:
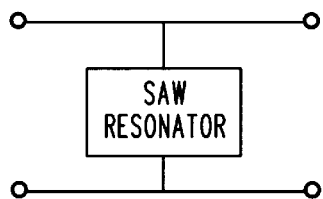
FIG. 13 shows a simplified schematic diagram of a shunt-connected SAW resonator.
Figure 14:
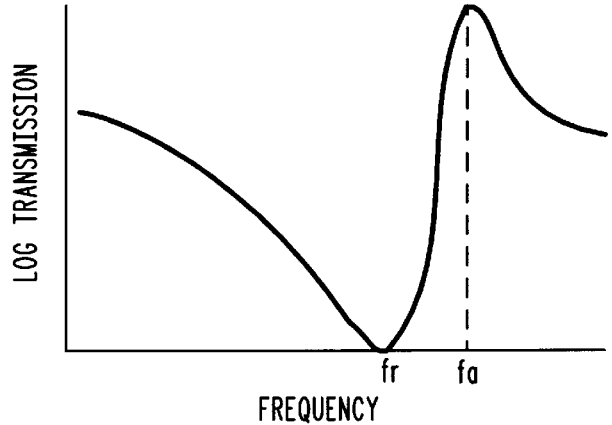
FIG. 14 shows a graphical representation of a frequency response of the resonator of FIG. 13.

The useful electrical properties of the SAW resonator may be illustrated in two cases. (1) When the resonator is connected in a series configuration, as shown in FIG. 11, the resulting electrical circuit has the response seen in FIG. 12. The circuit passes a radio frequency signal with low loss at frequencies near $f_r$, the series resonant frequency, and it attenuates the electrical signal at frequencies near $f_a$, the anti-resonant frequency. (2) When the resonator is connected in a shunt configuration, as shown in FIG. 13, the resulting electrical circuit has the response seen in FIG. 14. The circuit attenuates a radio frequency signal at frequencies near $f_r$, and it passes the electrical signal at frequencies near $f_a$.

As shown in FIG. 5, the present invention is an acoustic wave filter 10 which includes a piezoelectric substrate 20 having an upper surface 26 and in particular on a suitably-prepared, preferably polished, upper surface. At least one series resonator 22 including a plurality of interdigitated electrodes 14 is disposed on the upper surface 26 of the substrate 20. When electrically energized the electrodes 14 of the series resonator 22 cause acoustic waves to resonate at a first frequency. The filter 10 also includes at least one shunt resonator 24 including a plurality of interdigitated electrodes disposed on the upper surface 26 of the piezoelectric substrate 20. When electrically energized, the electrodes of the shunt resonator 24 cause acoustic waves to resonate at a second frequency higher than that of the first frequency. The series resonators 22 are electrically connected in series and each shunt resonator 24 is electrically connected in shunt to provide a ladder network.

The resonators 22, 24 comprise a series of periodically disposed interdigitated electrodes 14 of about one-fourth of an acoustic wavelength in width and gaps of about one-fourth of an acoustic wavelength therebetween. However, it should be appreciated that other arrangements are possible and in some applications are preferred. The electrodes 14 are disposed to have about one-half acoustic wavelength centers. The electrodes 14 are alternately coupled to their corresponding electrical terminals 16, 18, respectively, although other arrangements are possible and useful. When electrically energized via the terminals 16, 18, the electrodes 14 generate an acoustic wave which propagates substantially perpendicular to the interdigitated electrodes 14. The acoustic wave in the resonators 22, 24 has a characteristic periodicity and therefore a characteristic wavelength, $\lambda_T$.

The resonators 22, 24 can be constructed on suitably-prepared substrates such as ST-cut quartz, 41° rotated Y-cut X-propagating $LiNbO_3$, 64° rotated Y-cut X-propagating $LiNbO_3$, 36° rotated Y-cut X-propagating $LiTaO_3$, and 45° rotated X-cut Z-propagating $Li_2B_4O_7$ (lithium tetraborate). Preferably, the filter 10 is constructed on a polished substrate of 41° rotated Y-cut X-propagating $LiNbO_3$ (lithium niobate) due to its very high coupling coefficient and modest first order temperature response. A high coupling coefficient translates into improved insertion loss with a wide bandwidth and smaller device size. A moderate temperature coefficient allows for stable radio performance over temperature.

The present invention is particularly useful in providing low insertion loss together with high passband width, for which higher electromechanical coupling coefficient substrates are particularly well suited. In addition, the particular selection of lithium niobate provides good temperature characteristics, similar to that of ST-cut quartz, while providing a much higher coupling coefficient than ST-cut quartz. Further, lithium niobate devices provide higher reflectivity than ST-cut quartz which contributes to providing a wider bandwidth device for a given sized resonator.

In operation, the series resonators have a low impedance at the series resonant frequency which provides low insertion loss in the passband. At the antiresonant frequency their impedance is high which causes high insertion loss outside the passband. The number of series resonators is adjustable to provide a sufficiently narrow transition band between the passband and stopband. More series resonators provide a sharper transition band. In order to provide for sufficient width of the stopband, shunt resonators are connected in shunt between the series resonators. At their resonant frequencies the shunt resonators have a low impedance which provide high additional zeroes in the stopband.

In a preferred embodiment, the at least one series resonator has a resonant frequency in a passband of the filter and an antiresonant frequency in a stopband of the filter. The at least one shunt resonator has a resonant frequency in the stopband and an antiresonant frequency higher than the stopband. The shunt resonators provide two benefits. First, adding shunt resonators widens and lowers the stopband. Second, having the resonant frequency of the shunt resonators at the same frequency as the antiresonant (parallel resonant) frequency of the series resonators in the stopband helps maintain the rejection performance of the filter in the event where the loss near the antiresonant frequency of the series resonators is degraded.

This is most advantageous for the case of a transmitter filter where the passband is at a transmitter frequency and the stopband is at a receiver frequency. In this case, the widened and lowered stopband of the filter provides good isolation of the receiver frequency from the transmitter frequency. Also, the transition band between the transmitter and receiver bands is sharper which provides a better margin of performance.

Figure 1:
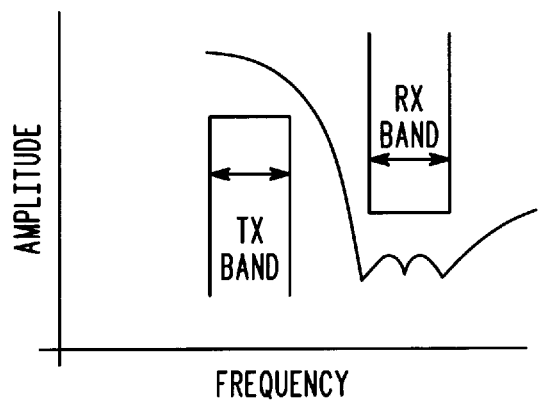
FIG. 1 is a graphical representation of a general form of a prior art transmit filter frequency response.
Figure 2:
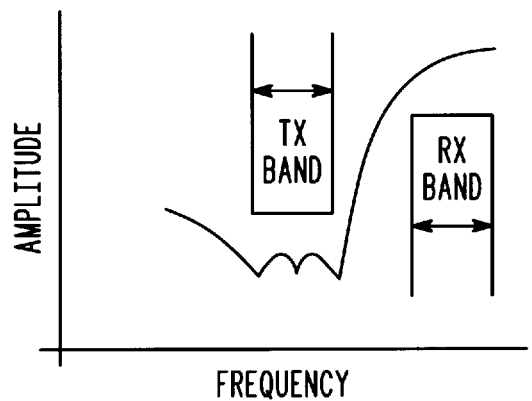
FIG. 2 is a graphical representation of a general form of a prior art receive filter frequency response.
Figure 3:
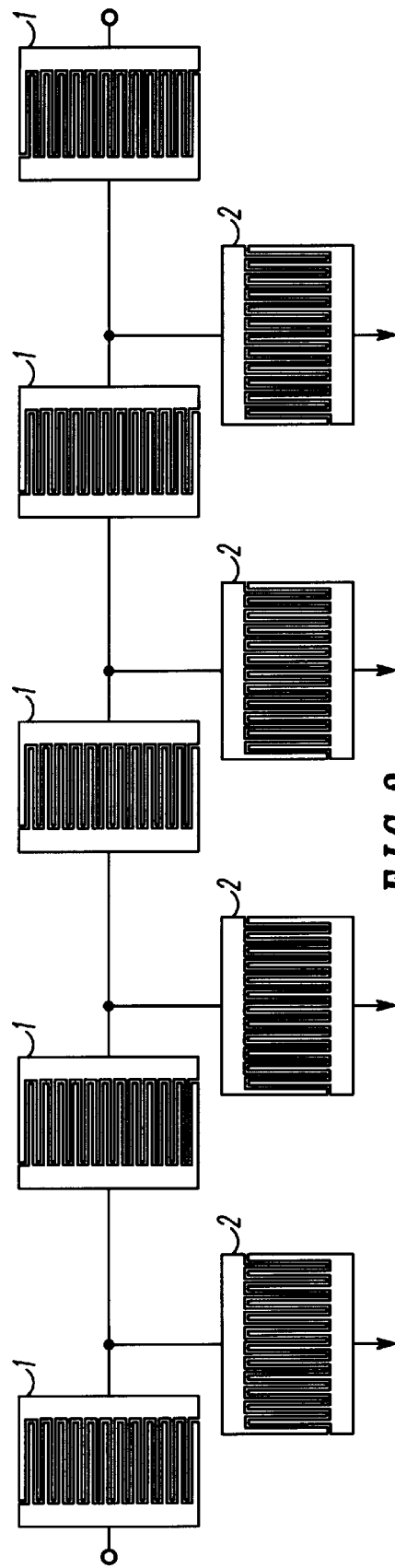
FIG. 3 is a simplified plan view of a prior art acoustic wave resonator filter configured in a ladder network.

In a preferred embodiment, the series resonators are configured to provide a low-pass frequency response, and the shunt resonators are used as capacitive impedance inverters within the passband. The use of a low-pass configuration in the transmitter band advantageously provides better insertion loss since at least one zero is removed from the low frequency side of the band. The shunt resonators, acting as capacitive impedance inverters provide a high impedance to ground in the passband and a low impedance to ground in the higher frequency stopband. An added benefit of a low-pass configuration having less zeroes is that the filter can be made physically smaller and at a lower cost. This is an important consideration in state-of-the-art radios where weight, size and cost are critical factors. For example, a filter can be provided with five elements (as shown in FIG. 5) which meets the same performance specifications of the prior art nine element filter of FIG. 3.

Figure 4:
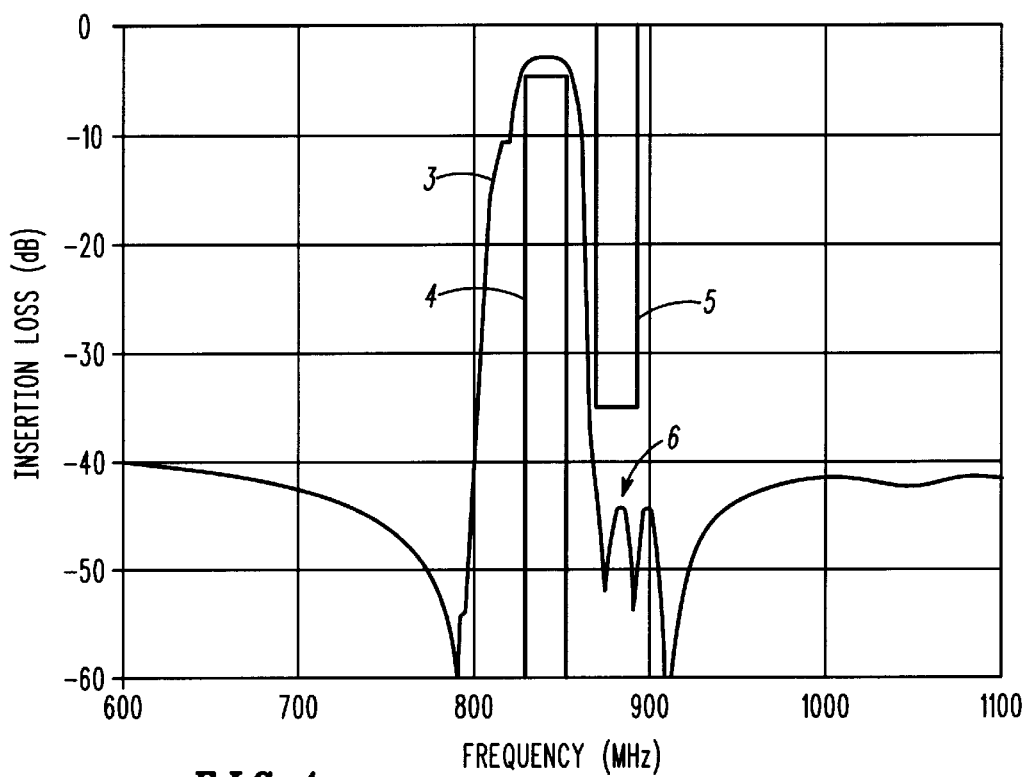
FIG. 4 is graphical representation of transmit filter frequency response for the filter of FIG. 3.
Figure 6:
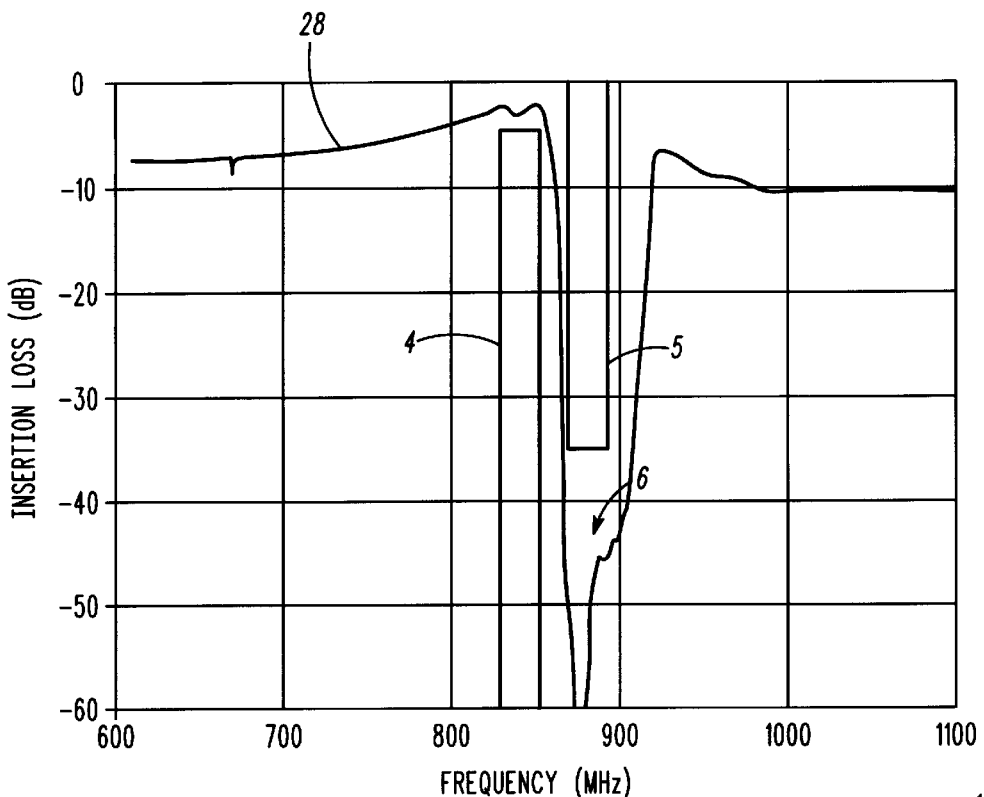
FIG. 6 shows a graphical representation of a frequency response of the filter of FIG. 5, in accordance with the present invention.

FIG. 6 shows a representation of a frequency response 28 of a SAW filter such as is shown in FIG. 5, which meets a desired transmitter specification 4 and stopband receiver specification 5. The insertion loss of the frequency response 28 in the passband is sufficient to meet the specification 4, and the bandwidth in the passband is wider than the prior art filter of FIG. 4. A wide bandwidth is useful to accommodate frequency shifts due to external affects such as temperature changes. In addition, the stopband 6 shown by the representation is more than adequate to meet the receiver specification 5.

In a more preferred embodiment, the electrodes are of aluminum having a predetermined thickness such that the resonant frequency of all resonators have improved reduced loss. It was found that the loss near the series resonant frequency of the resonators can be reduced by adjusting the electrode metallization thickness to a critical value. Normally, reducing the loss near of the series resonant frequencies increases the loss at the antiresonant frequency which would normally degrade the stopband response of the filter unacceptably. However, the present invention advantageously compensates for any increase in loss near the antiresonant frequency of the series resonators in the stopband by using a low-pass configuration and by providing a low loss zero in the stopband due to the series resonant frequency of the shunt resonator. Since increased loss in the stopband is no longer an issue, the metallization thickness is selected to optimize the loss of the series resonators, which delivers the best insertion loss without regard to resonator loss in the stopband.

As a further enhancement to the performance of resonant element filters, the present invention defines an "average energy loss (AEL)" for a resonant element as:

$$AEL = \frac{\int_0^\infty EL(f)W(f)df}{\int_0^\infty W(f)df}$$

where EL(f) is the energy loss as a function of frequency, f. For a one-port resonator energy loss is the energy which is not reflected back to a signal generator. W(f) is a weighting function which is defined to emphasize the energy in the vicinity of the resonant frequencies. Specifically, the following definition is used:

$$W(f) = \cos\left(\frac{\pi}{2}\left[\frac{f-f_c}{N_w B_w}\right]\right)^2 \quad \text{for } |f-f_c| \leq N_w B_w$$

and $$W(f) = 0 \quad \text{for } |f-f_c| > N_w B_w$$

although other definitions are possible. This definition permits the evaluation of the performance of a resonator element continuously across a band of frequencies which occur in the vicinity of a filter passband. The AEL figure of merit measures an averaged value of energy which is dissipated within the resonator element. Smaller values of AEL indicate better resonator performance. It is advantageous to use AEL as a figure of merit because SAW resonators contain loss mechanisms which have relatively broad frequency extent and are relatively strong. This is in contrast to quartz crystal plate bulk acoustic wave resonators which are very much less lossy, and where it becomes more meaningful to evaluate these losses at critical frequency points such as the resonant frequency.

Figure 7:
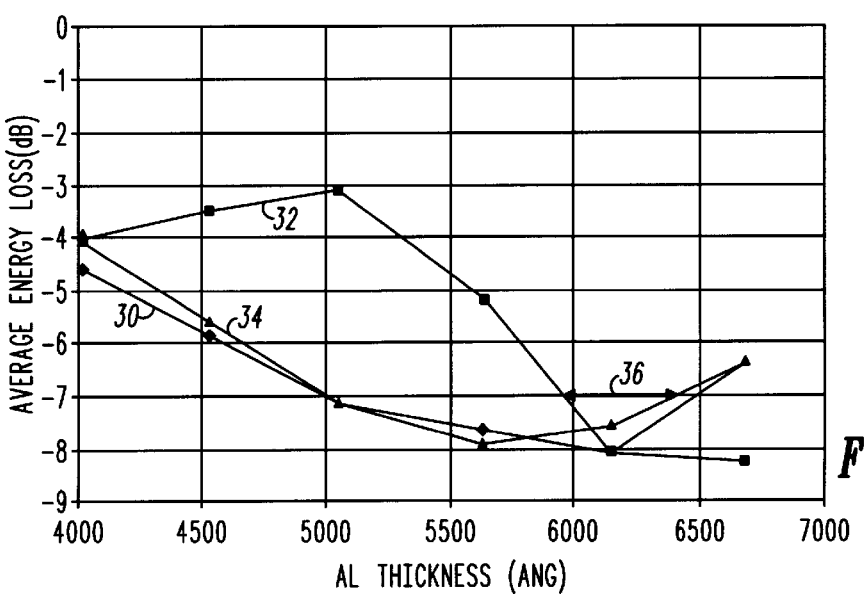
FIG. 7 shows a graphical representation of the change in average energy loss versus electrode metal thickness, in accordance with the present invention.

FIG. 7 shows a graph of actual test data of AEL versus metal thickness behavior for three different resonator configurations. The first curve 30 represents configuration A. The second curve 32 represents configuration B. The third curve 34 represents configuration C. Table 1 shows the specific resonator configurations.

TABLE 1

High Q/Low Loss Configurations

| Configuration | A | B | C |
|---|---|---|---|
| Number of electrodes | 151 | 301 | 101 |
| Number of reflector strips | 11 | 11 | 11 |
| Capacitance (pf) | 1.87 | 7.34 | 0.97 |
| Transducer wavelength (µm) | 4.35 | 4.99 | 4.34 |
| Reflector wavelength (µm) | 4.47 | 4.90 | 4.33 |
| Transducer/reflector gap (µm) | 2.79 | 3.06 | 2.70 |
| Beam width (µm) | 41.2 | 81.3 | 32.1 |

In the present invention, it was found that measured AEL for the three configurations is significantly reduced as metal thickness is increased beyond 10% of the wavelength. More particularly, a critical range of values 36 of metal thickness was found for the specific case of a resonator of wavelength 4.7 microns fabricated on 41° rotated Y-cut X-propagating LiNbO$_3$ with aluminum metallization of about 5900 Å to 6400 Å (12% to 15% of the wavelength). For metal thicknesses less than 5000 Å resonators with differing capacitances tend to divergent behavior with respect to average energy loss. However, for metal thicknesses above 5000 Å the resonator average energy losses begin to converge until from about 5900 Å to about 6400 Å the AEL is uniformly reduced by a factor of two (from 4 dB to 7 dB) below the AEL for thin metallizations (below 4000 Å). In this case, the performance of both the series and shunt connected resonators in a ladder filter are improved to have minimized AEL. Resultingly, the insertion loss in the passband of the filter is sufficient to meet specifications, and the rejection in the stopband of the filter is maintained to provide good receiver isolation.

The results of FIG. 7 can be normalized to the acoustic wavelength at an arbitrary frequency near the passband of the filter such that the results can be scaled to any other designed frequency. It is well known in the art that, when a film is fabricated on a SAW substrate, the value of physical properties such as SAW velocity, loss, coupling strength, etc., which are determined at a specific film thickness (t) and a specific wavelength (λ) can be normalized to t/λ where t/λ can be thought of as a fundamental independent variable. For the present invention, the optimal normalized metal thickness to wavelength ratio, t/λ, is about twelve to fifteen percent. For example, where a metallization thickness of 6000 Å (0.6 microns) on a device with a wavelength of 4.7 microns (t/λ=12.7%) produced a minimum AEL, then the AEL will also be minimum for any pair of t and λ for which t/λ is about 0.12 to about 0.15.

Figure 8:
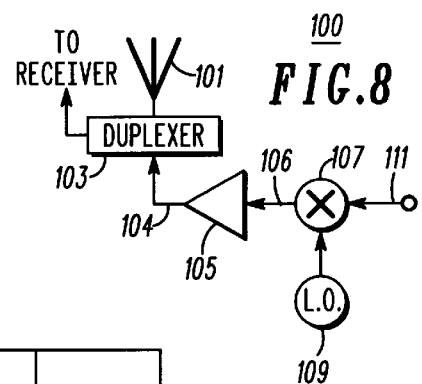
FIG. 8 shows a simplified schematic diagram of a radio communication device including the filter of FIG. 5, in accordance with the present invention.

FIG. 8 is a block diagram of a portion 100 of a radio communication apparatus including a duplexer 103 incorporating a filter in accordance with the present invention. The portion 100 of the radio apparatus includes an antenna 101, by way of example, used to receive and/or transmit signals. Alternatively, the antenna 101 could be replaced by a cable or other signal transmissive media. The duplexer 103 is coupled to the antenna 101 and to a receiver portion (not shown). The duplexer 103 is a special purpose filter which couples transmitter signals 104 from an amplifier 105 to the antenna 101 via the duplexer transmitter filter according to the present invention. A mixer 107 provides a signal 106 to an input of the amplifier 105. The signal 106 from provided a signal 106 from a mixer 107. The signal 106 from the mixer 107 is derived from a local oscillator 109 coupled to the mixer 107 and a desired signal 111 to be transmitted. The desired signal 111 is combined with the frequency from the local oscillator 109 in the mixer 107. The arrangement of the present invention may also be used to provide a "transmit clean-up filter" which may be provided in accordance with the present invention. Thus, an acoustic filter has been described which accomplishes certain advantages relative to prior art methods and mechanisms. The improvements over known technology are significant. The expense, complexities, and high parts count of prior art filters are avoided.

The present invention also includes a method for improving insertion loss in a passband of a duplexer transmitter filter while maintaining rejection in a stopband of the duplexer transmitter filter. The method includes a first step of providing a piezoelectric substrate. Preferably, the piezoelectric substrate is polished. A second step includes disposing at least one series resonator being electrically connected in series with other series resonators. Each series resonator includes a plurality of aluminum interdigitated electrodes on the substrate having a periodicity defining an acoustic frequency within the passband of the filter. A third step includes disposing at least one shunt resonator being electrically connected in shunt with the series resonators to form a ladder network. Each shunt resonator includes a plurality of aluminum interdigitated electrodes on the substrate having a periodicity defining an acoustic frequency within the stopband of the filter.

Preferably, the disposing steps of the method include disposing the aluminum to a predetermined thickness such that the resonant frequency of the resonators have minimum AEL with the shunt resonators compensating for any degradation in Q and any increase of loss near the antiresonant frequency of the series resonators in the stopband.

More preferably, the disposing steps of the method include disposing the aluminum to a normalized thickness to wavelength ratio, t/λ, of about twelve to fifteen percent such that the resonant frequencies of the resonators have substantially minimum AEL. This provides for improved insertion loss in the passband of the filter and maintains the rejection in the stopband of the filter.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An acoustic wave filter, comprising:

a piezoelectric substrate having an upper surface;

at least one series resonator including a plurality of interdigitated electrodes disposed on the upper surface, when electrically energized the electrodes causing acoustic waves to resonate at a first resonant frequency within a passband of the filter and to provide a first antiresonant frequency within a stopband of the filter at least one shunt resonator including a plurality of interdigitated electrodes disposed on the upper surface, when electrically energized the electrodes causing acoustic waves to resonate at a second resonant frequency higher than the first resonant frequency and within a stopband of the filter so as to widen the stopband and to provide a second antiresonant frequency higher than the stopband; and the series resonators being electrically connected in series and each shunt resonator being electrically connected in shunt to provide a ladder network, the series resonators are configured to provide a low-pass frequency response, and the shunt resonators are used as capacitive impedance inverters within the passband.

2. The filter of claim 1, wherein the filter includes less than four series resonators and less than four shunt resonators.

3. The filter of claim 1, wherein the filter is a transmitter filter having the passband at a transmitter frequency and the stopband at a receiver frequency.

4. The filter of claim 1, wherein the electrodes have a predetermined thickness such that the resonant frequency of the resonators have reduced average energy loss, the shunt resonators compensating for any increase in loss and any degradation of Q near the antiresonant frequency of the series resonators in the stopband.

5. The filter of claim 4, wherein the electrodes have a normalized thickness to wavelength ratio of about twelve to fifteen percent so as to provide substantially minimum average energy loss in the vicinity of the resonant frequencies of the resonators such that insertion loss in the passband of the filter is improved and rejection in the stopband of the filter is maintained.

6. A method for improving insertion loss in a passband while maintaining rejection in a stopband of a duplexer transmitter filter, comprising the steps of:

providing a piezoelectric substrate;

disposing at least one series resonator being electrically connected in series with the at least on series resonator including a plurality of aluminum interdigitated electrodes on the substrate having a periodicity defining an acoustic frequency within the passband of the filter, wherein the electrodes have a predetermined thickness such that a resonant frequency of the series resonators have reduced average energy loss; and disposing at least one shunt resonator being electrically connected in shunt with the at least one shunt resonator including a plurality of aluminum interdigitated electrodes on the substrate having a periodicity defining an acoustic frequency within the stopband of the filter, wherein the electrodes have a predetermined thickness such that a resonant frequency of the shunt resonators compensate for any degradation of Q at the antiresonant frequency of the series resonators in the stopband.

7. The method of claim 6, wherein the disposing steps include disposing the aluminum to a normalized thickness to wavelength ratio of about twelve to fifteen percent so as to provide substantially minimum average energy loss in the vicinity of the resonant frequencies of the resonators such that insertion loss in the passband of the filter is improved and rejection in the stopband of the filter is maintained.

8. A transmitter acoustic wave filter for a duplexer, comprising:

a piezoelectric substrate having an upper surface;

two series resonators each including a plurality of interdigitated electrodes disposed on the upper surface, when electrically energized the electrodes causing acoustic waves to resonate at a passband frequency of the transmitter, the series resonators having an antiresonant frequency at a stopband frequency corresponding to a receiver frequency;

three shunt resonators each including a plurality of interdigitated electrodes disposed on the upper surface, when electrically energized the electrodes causing acoustic waves to resonate substantially at the stopband frequency; and the series resonators being electrically connected in series and each shunt resonator being electrically connected in shunt to provide a ladder network.

9. The filter of claim 8, wherein the series resonators are configured to provide a low-pass frequency response, and the shunt resonators are used as capacitive impedance inverters within the passband.

10. The filter of claim 8, wherein the electrodes have a predetermined thickness such that the resonant frequency of the resonators have reduced average energy loss, the shunt resonators compensating for any increase of loss near the antiresonant frequency of the series resonators in the stopband.

11. The filter of claim 10, wherein the electrodes have a normalized thickness to wavelength ratio of about twelve to fifteen percent so as to provide substantially minimum average energy loss in the vicinity of the resonant frequencies of the resonators such that insertion loss in the passband of the filter is improved and rejection in the stopband of the filter is maintained.

12. A radio communication device, the device including a duplexer transmitter filter, comprising:

a piezoelectric substrate having an upper surface;

at least one series resonator including a plurality of interdigitated electrodes disposed on the upper surface, when electrically energized the electrodes causing acoustic waves to resonate at a first resonant frequency;

at least one shunt resonator including a plurality of interdigitated electrodes disposed on the upper surface, when electrically energized the electrodes causing acoustic waves to resonate at a second resonant frequency higher than the first resonant frequency; and the series resonators being electrically connected in series and each shunt resonator being electrically connected in shunt to provide a ladder network, the series resonators are configured to provide a low-pass frequency response, and the shunt resonators are used as capacitive impedance inverters within a passband of the filter.

13. The device of claim 12, wherein the filter includes less than three series resonators and less than four shunt resonators.

14. The device of claim 12, wherein the series resonators have a resonant frequency within a passband of the filter and an antiresonant frequency within a stopband of the filter, and the shunt resonators have a resonant frequency in the stopband so as to widen the stopband.

15. The device of claim 12, wherein the electrodes have a predetermined thickness such that the resonant frequency of the resonators have reduced average energy loss, the shunt resonators compensating for any increase in loss and any degradation of Q near the antiresonant frequency of the series resonators in the stopband.

16. The device of claim 15, wherein the electrodes have a normalized thickness to wavelength ratio of about twelve to fifteen percent so as to provide substantially minimum average energy loss in the vicinity of the resonant frequencies of the resonators such that insertion loss in the passband of the filter is improved and rejection in the stopband of the filter is maintained.

* * * * *

UNITED STATES PATENT AND TRADEMARK OFFICE
CERTIFICATE OF CORRECTION

PATENT NO. : 5,854,579
DATED : December 29, 1998
INVENTOR(S) : Penunuri et al.

It is certified that error appears in the above-indentified patent and that said Letters Patent is hereby corrected as shown below:

On the title page, item

[75] Inventor: reads "David Penunuri, Fountain Hills, Ariz." should be —David Penunuri, Fountain Hills, Ariz.; Richard S. Kommrusch, Albuquerque, New Mexico --.

Signed and Sealed this

Sixth Day of April, 1999

Attest:

Q. TODD DICKINSON

Attesting Officer

Acting Commissioner of Patents and Trademarks